US012658917B2

(12) United States Patent     (10) Patent No.:   US 12,658,917 B2

Kondo et al.     (45) Date of Patent:    Jun. 16, 2026

(54) ON-BOARD DEVICE

(71) Applicant: SUMITOMO WIRING SYSTEMS, LTD., Mie (JP)

(72) Inventors: Toru Kondo, Mie (JP); Isao Tokumoto, Mie (JP); Takuya Iida, Mie (JP)

(73) Assignee: SUMITOMO WIRING SYSTEMS, LTD., Mie (JP)

( * ) Notice: Subject to any disclaimer, the term of this patent is extended or adjusted under 35 U.S.C. 154(b) by 43 days.

(21) Appl. No.: 18/880,639

(22) PCT Filed: Jun. 20, 2023

(86) PCT No.: PCT/JP2023/022788

§ 371 (c)(1),
(2) Date: Jan. 2, 2025

(87) PCT Pub. No.: WO2024/009758

PCT Pub. Date: Jan. 11, 2024

(65) Prior Publication Data

US 2026/0012181 A1     Jan. 8, 2026

(30) Foreign Application Priority Data

Jul. 6, 2022    (JP) ................................. 2022-109144

(51) Int. Cl.
*H03K 19/013*     (2006.01)
*H03K 19/0175*     (2006.01)
*H03K 19/018*     (2006.01)

(52) U.S. Cl.
CPC ..... *H03K 19/0136* (2013.01); *H03K 19/0175* (2013.01); *H03K 19/018* (2013.01); *H03K 19/01806* (2013.01)

(58) Field of Classification Search
CPC ......... H03K 19/0136; H03K 19/01806; H03K 19/0175; H03K 19/018; H03K 17/567;
(Continued)

(56) References Cited

U.S. PATENT DOCUMENTS 3,958,136 A * 5/1976 Schroeder ........ H03K 19/00353
326/26
4,678,944 A * 7/1987 Williams ......... H03K 19/01806
326/78

FOREIGN PATENT DOCUMENTS

EP     3399322 A1 * 11/2018 ..... H03K 19/017509
JP     55-002237     1/1980
(Continued)

OTHER PUBLICATIONS

International Search Report issued in WIPO Patent Application No. PCT/JP2023/022788, dated Sep. 12, 2023, along with an English translation thereof.

*Primary Examiner* — Daniel D Chang
(74) *Attorney, Agent, or Firm* — Greenblum & Bernstein P.L.C

(57) ABSTRACT

An on-board device installed in a vehicle and is provided with an input circuit including an input end into which an input voltage is entered, and a drive power supply circuit that outputs a drive voltage to the input circuit. The input circuit includes a PNP bipolar transistor, a pull-up circuit, a second pull-up resistance, and a base resistance. The pull-up circuit includes a pull-up power supply, a first pull-up resistance, and a second diode with an anode facing the first pull-up resistance, which are connected in series and are provided between a base of the PNP bipolar transistor and the input end. The second pull-up resistance is provided between the base of the PNP bipolar transistor and the drive power supply circuit. The base resistance is provided
(Continued)

between the base of the PNP bipolar transistor and the second pull-up resistance.

4 Claims, 3 Drawing Sheets

(58) Field of Classification Search
CPC ....... H03K 17/687; H03K 17/16; H02M 1/32;
B60R 16/02; B60R 16/023
See application file for complete search history.

(56) References Cited

FOREIGN PATENT DOCUMENTS

| | | |
|---|---|---|
| JP | 03-184409 | 8/1991 |
| JP | 2009-117946 | 5/2009 |
| JP | 2010-004304 | 1/2010 |

* cited by examiner

[Fig. 1]
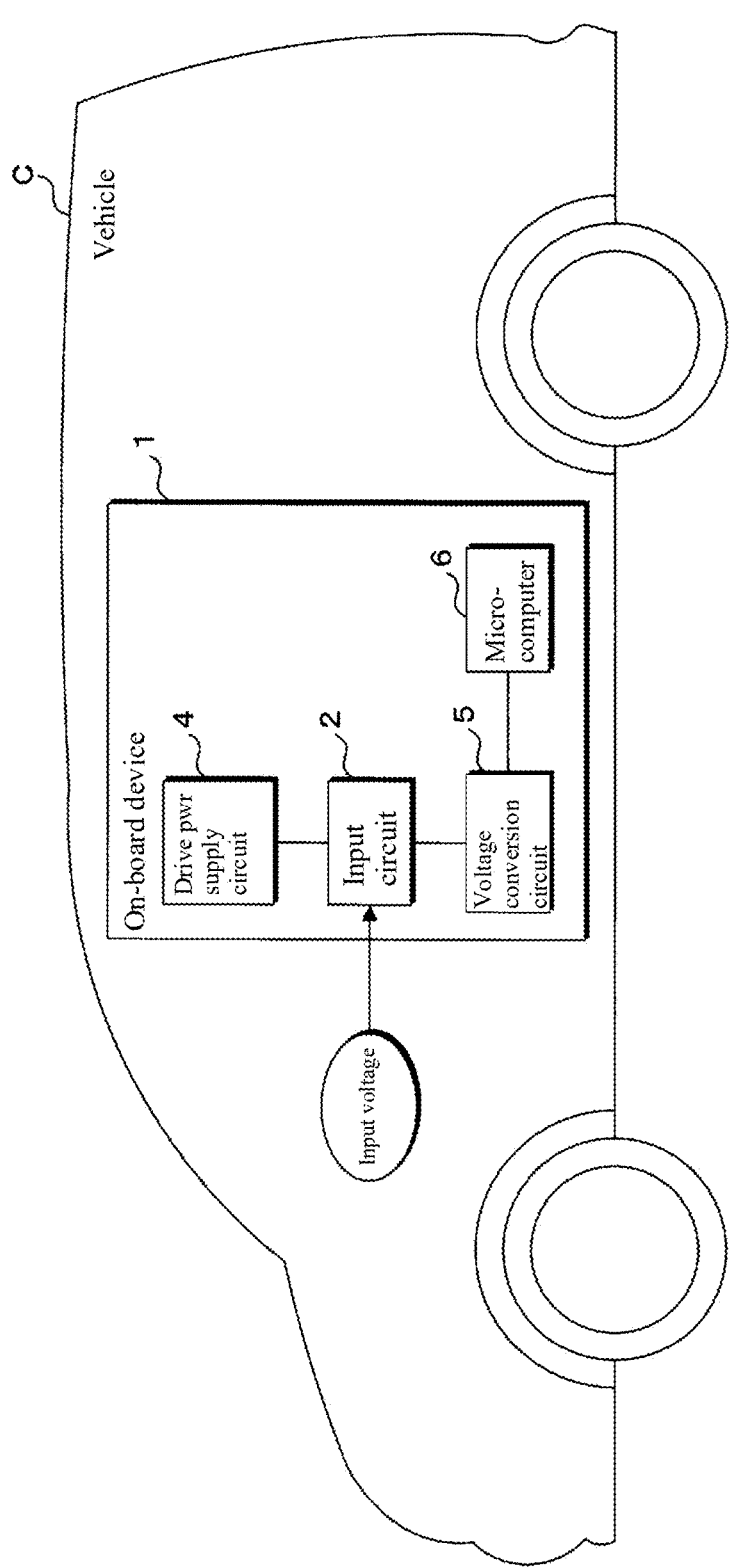

[Fig. 2]
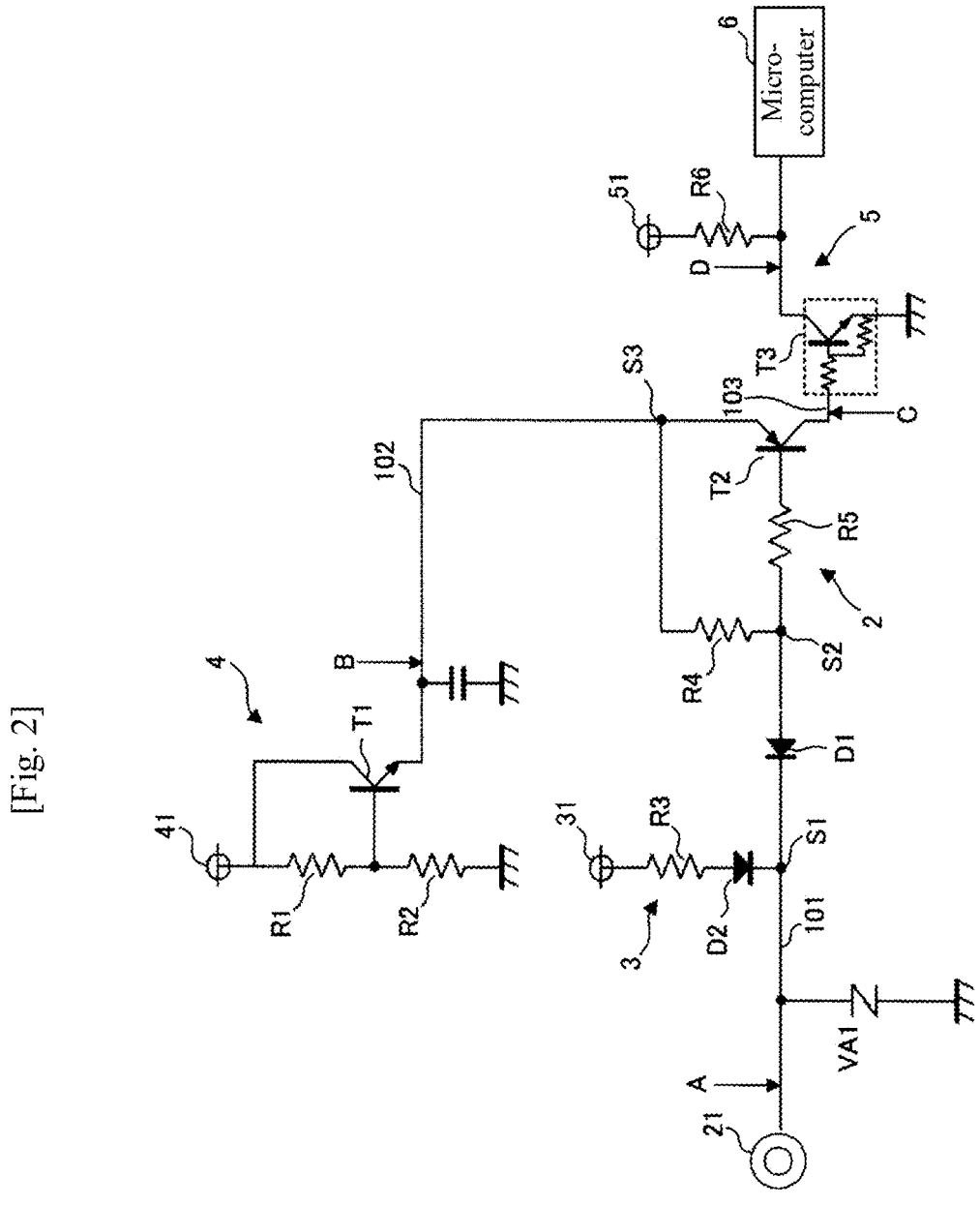

[Fig. 3]
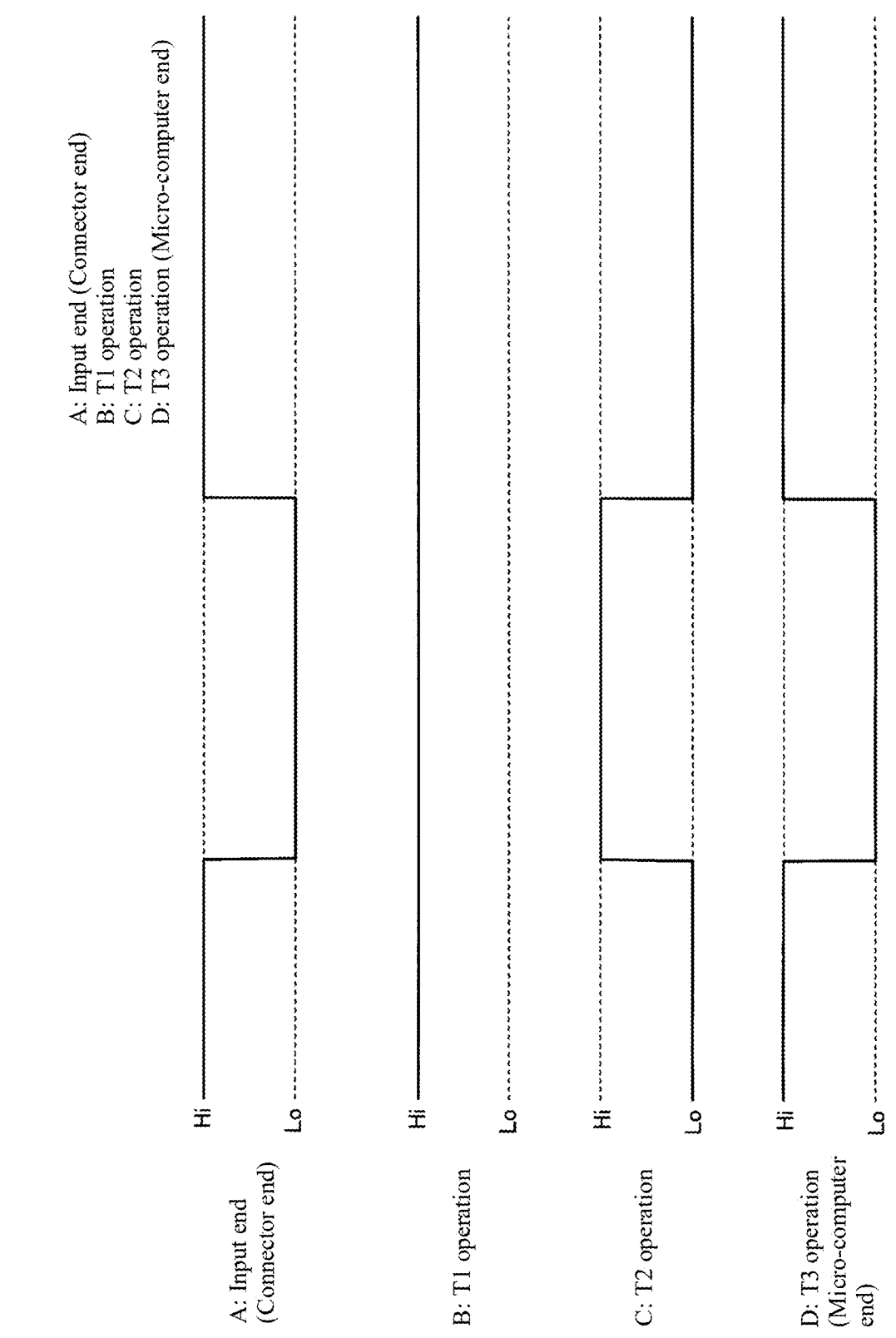

ON-BOARD DEVICE

FIELD OF THE INVENTION

The present disclosure relates to an on-board device. The present application claims priority based on Japanese Application No. 2022-109144 filed Jul. 6, 2022, and incorporates all contents described in the Japanese Application.

BACKGROUND OF THE INVENTION

A constant current driver that drives a load by a current is disclosed (for example, Patent Literature 1). The constant current driver includes a first current drive circuit that is connected between a first terminal and a second terminal, and a second current drive circuit that is connected between a third terminal and the first terminal or the second terminal, and the current flowing through the load is divided into the first current drive circuit and the second current drive circuit. The first current drive circuit is configured by a first operational amplifier and a first transistor, and the first transistor is connected such that a current flows between the first terminal and the second terminal.

RELATED ART

Patent Literature

Patent Literature 1: Japanese Patent Laid-Open Publication No. 2008-161078

SUMMARY OF THE INVENTION

An on-board device according to one aspect of the present disclosure is an on-board device installed in a vehicle and is provided with an input circuit including an input end into which an input voltage is entered, and a drive power supply circuit that outputs a drive voltage to the input circuit. The input circuit includes a PNP bipolar transistor, a pull-up circuit, a second pull-up resistance, and a base resistance. The pull-up circuit includes a pull-up power supply, a first pull-up resistance, and a second diode with an anode facing the first pull-up resistance, which are connected in series and are provided between a base of the PNP bipolar transistor and the input end. The second pull-up resistance is provided between the base of the PNP bipolar transistor and the drive power supply circuit. The base resistance is provided between the base of the PNP bipolar transistor and the second pull-up resistance. And, between a connection point of the second pull-up resistance with the base resistance and the input end, a first diode is interposed with a cathode facing the input end.

BRIEF DESCRIPTION OF THE DRAWINGS

FIG. 1 is a schematic view illustrating an overview of an on-board device installed in a vehicle according to a first embodiment.

FIG. 2 is a circuit diagram illustrating a configuration such as an input circuit included in the on-board device.

FIG. 3 is an explanatory diagram (timing diagram) describing operations of the input circuit and the like.

MODE FOR CARRYING OUT THE INVENTION

Problems to be Solved by the Disclosure

In a constant current driver using a transistor described in Patent Literature 1, when determining high or low based on a predetermined threshold value with respect to the voltage being entered, a point about efficiently determining is not considered even when the threshold value is small.

In view of the circumstances above, the present disclosure provides an on-board device with an input circuit that can efficiently make a determination with respect to the voltage being entered.

Effect of the Disclosure

According to one aspect of the present disclosure, the on-board device with the input circuit that efficiently makes a determination with respect to the voltage being entered can be provided.

DESCRIPTION OF THE EMBODIMENTS OF THE DISCLOSURE

First, embodiments of the present disclosure are listed with explanation. Also, at least a portion of the embodiments described below may be combined as desired.

(1) An on-board device according to one aspect of the present disclosure is an on-board device installed in a vehicle and is provided with an input circuit including an input end into which an input voltage is entered, and a drive power supply circuit that outputs a drive voltage to the input circuit. The input circuit includes a PNP bipolar transistor, a pull-up circuit, a second pull-up resistance, and a base resistance. The pull-up circuit includes a pull-up power supply, a first pull-up resistance, and a second diode with an anode facing the first pull-up resistance, which are connected in series and are provided between a base of the PNP bipolar transistor and the input end. The second pull-up resistance is provided between the base of the PNP bipolar transistor and the drive power supply circuit. The base resistance is provided between the base of the PNP bipolar transistor and the second pull-up resistance. And, between a connection point of the second pull-up resistance with the base resistance and the input end, a first diode is interposed with a cathode facing the input end.

According to this aspect, the on-board device includes the input circuit, the drive power supply circuit that outputs the drive voltage into the input circuit, and a voltage conversion circuit connected to an output end of the input circuit. A low-side input circuit device is configured by the input circuit and the drive power supply circuit. The on-board device including the low-side input circuit device serves as a relaying apparatus such as a body ECU and a CAN gateway that controls driving of a body system actuator installed in a vehicle or as an electrical connection box with a semiconductor fuse, for example. The on-board device (low-side input circuit device) outputs a high or low signal (output voltage) in accordance with the input voltage entered from the input end of the input circuit (connector end where an input connector is connected). The high or low signal (output voltage) is output to a micro-computer and the like from the voltage conversion circuit connected to the output end of the input circuit, for example. The micro-computer to which the high or low signal (output voltage) is entered performs various control processing or arithmetic processing based on the signal (output voltage). The Input circuit includes the PNP bipolar transistor, and a first conducting path extending from the input end (connector end) is connected to the base of the PNP bipolar transistor. The first diode and base resistance are provided interposing to the first conducting path, and in this case, the voltage of input end (V: input end voltage) is a value subtracting a voltage drop of the first diode (VfD: forward voltage) and a voltage drop (Vbe) between an emitter and the base of the PNP bipolar transistor from the drive voltage (V_OUT) (V=V_OUT−Vf−Vbe). When the threshold value (threshold value at ON/OFF voltage) determining high or low with respect to the input voltage (Vin) being entered to the input end is relatively a small value (low voltage), influence in variations grows due to temperature characteristics and the like of each element determining the input end voltage. In contrast, what affects the input end voltage (V) is a voltage drop of the first diode provided interposing to a second first conducting path and a voltage drop between the emitter and base of the PNP bipolar transistor, and therefore, variations can be reduced achieving high accuracy of the threshold value. For example, when a bias resistor built-in digital transistor is used, by a resistor divider ratio (Ri+Rb)/Ri) of internal resistance (Ri) and base resistance (Rb) of the digital transistor, the voltage drop between the emitter and base of the PNP bipolar transistor is determined (Vbe×(Ri+Rb)/Ri). In this case, an error (variation) in the internal resistance (Ri) of the digital transistor may be large, and there is a concern that the resistor divider ratio may change significantly. In contrast, as described above, the input circuit uses the PNP bipolar transistor to connect the second pull-up resistance and the base resistance in parallel, thereby the resistor divider can be eliminated (unnecessary) and the variation can be reduced compared to when the digital transistor is used. Accordingly, high accuracy of the threshold value can be achieved, and also a relatively inexpensive element can be used, and therefore, product cost can be reduced.

(2) The on-board device according to one aspect of the present disclosure has the drive power supply circuit including a drive power supply, an NPN bipolar transistor, a first resistance, and a second resistance connected with the first resistance in series, and the drive voltage in accordance with the resistor divider ratio from the first resistance and the second resistance is output.

According to this aspect, the drive power supply circuit includes the drive power supply, the NPN bipolar transistor, the first resistance, and the second resistance connected with the first resistance in series, and is configured by an emitter follower circuit, for example. By configuring the drive power supply circuit using the emitter follower circuit in this way, the output voltage can be adjusted by the resistor divider ratio from the first resistance (R1) and the second resistance (R2) such that the output voltage (V_OUT) by the drive power supply circuit is constant toward the output voltage (V_OUT) of the drive power supply. In addition, by changing resistance constant of these first resistance (R1) and the second resistance (R2), it is possible to adjust the threshold value (threshold value at ON/OFF voltage) when determining low or high, thereby availability in the drive power supply circuit can be improved.

(3) The on-board device according to one aspect of the present disclosure is further provided with the voltage conversion circuit that performs a voltage conversion between the input circuit and the micro-computer, and the voltage conversion circuit is a level shift circuit including a level shift power supply and the digital transistor, and the voltage converted by the level shift circuit is output to the micro-computer connected to a collector of the digital transistor.

According to this aspect, the voltage conversion circuit is configured by the level shift circuit including the level shift power supply and the digital transistor, and the output voltage to which a level shift (voltage conversion) is performed by the level shift circuit is output from the voltage conversion circuit. In this way, voltage conversion is performed between the input circuit and the micro-computer by the voltage conversion circuit. For example, when an electronic component with a calculation function such as a micro-computer, an integrated circuit (IC), an application specific integrated circuit (ASIC), or a field-programmable gate array (FPGA) is connected to the output end (micro-computer end) of the voltage conversion circuit, a threshold voltage of the micro-computer and the like may not correspond to the output voltage from the drive power supply circuit. Even in such a case, by using the output voltage of the level shift power supply of the voltage conversion circuit (level shift circuit), it is possible to correspond to (satisfy) the threshold voltage of the micro-computer and the like without depending on the output voltage (pull-up voltage) from the drive power supply circuit.

Details of the Embodiments of the Disclosure

The present disclosure is concretely described based on the drawings illustrating the embodiments. An on-board device 1 according to an embodiment of the present disclosure is described with reference to the following drawings. The present disclosure is not limited to these examples, and is intended to include equivalents of the scope of the claims and all modifications within the scope recited in the scope of claims.

First Embodiment

Hereafter, an embodiment is described with reference to the drawings. FIG. 1, is a schematic view illustrating an overview of the on-board device 1 installed in a vehicle C according to a first embodiment. FIG. 2, is a circuit diagram illustrating a configuration such as an input circuit 2 included in the on-board device 1. The on-board device 1 is installed in the vehicle C and is provided with the input circuit 2 and a drive power supply circuit 4 that outputs the drive voltage into the input circuit 2, and may further include a voltage conversion circuit 5 that is connected to an output end of the input circuit 2. The on-board device 1 may further include a micro-computer 6 that is connected to the voltage conversion circuit 5. The drive power supply circuit 4 and the input circuit 2 are connected via a second conducting path 102. The input circuit 2 and the voltage conversion circuit 5 are connected via a third conducting path 103.

A low-side input circuit device is configured by the input circuit 2, the drive power supply circuit 4, and the voltage conversion circuit 5. The on-board device 1 serving as the low-side input circuit device outputs a signal (output voltage) indicating high (Hi) or low (Lo) to the micro-computer 6 in accordance with the voltage value of the input voltage being entered to the input circuit 2. As described in detail below, the input circuit 2 and the drive power supply circuit 4 determine a threshold value (threshold value at ON/OFF voltage) when determining high or low with respect to the input voltage. The input circuit 2 includes a PNP bipolar transistor T2 and has a configuration that eliminates a divider ratio by a base resistance R5 and the like, and therefore, a relatively low voltage threshold value can be set. In addition, the variation of the threshold value can be made small by achieving a high accuracy of the threshold value.

The drive power supply circuit 4 includes a drive power supply 41, an NPN bipolar transistor T1, a first resistance R1, and a second resistance R2. The drive power supply 41 outputs a predetermined voltage (5V, for example), after stepping down, by using a regulator or the like, the voltage (12V, for example) supplied from a power supply device such as a lead battery or an alternator installed in the vehicle C.

The NPN bipolar transistor T1 is connected to the drive power supply 41, and the voltage output from the drive power supply 41 is constantly applied to the NPN bipolar transistor T1. A wire extending from the drive power supply 41 to the NPN bipolar transistor T1 is split into two, and each of the two split ends is connected to a base and a collector of the NPN bipolar transistor T1.

The first resistance R1 is provided interposingly between the drive power supply 41 and the base of the NPN bipolar transistor T1. The second resistance R2 is provided interposing to a wire extending from the first resistance R1 to the ground. In other words, a wire extending from the connection point of the first resistance R1 with the second resistance R2 is connected to the base of the NPN bipolar transistor T1. With such a connection configuration, the first resistance R1 and the second resistance R2 are connected in series, and the base of NPN bipolar transistor T1 is connected to the connection point of the first resistance R1 with the second resistance R2, and thereby the voltage output from an emitter of NPN bipolar transistor T1 becomes a voltage value corresponding to the resistor divider ratio between the first resistance R1 and the second resistance R2.

In this way, the drive power supply circuit 4 is configured by an emitter follower circuit that steps down the output voltage (VCC) from the drive power supply 41 to a predetermined voltage (V_OUT) in accordance with the resistor divider ratio between the first resistance R1 and the second resistance R2. The stepped-down voltage corresponds to the output voltage (V_OUT) as the drive power supply circuit 4. By using the emitter follower circuit, the NPN bipolar transistor T1 is used in an analog fashion based on the operating principle of a linear regulator, and the output voltage (V_OUT) can be adjusted by the resistor divider ratio. Accordingly, a relatively expensive comparator is not necessary which makes it possible to achieve (fulfill) necessary functions in a low-cost configuration.

The output voltage is adjusted by the resistor divider ratio (V_OUT=VCC*R2/(R1+R1)−Vbe [voltage drop between the emitter and the base of the NPN bipolar transistor T1]) from the first resistance R1 ($\Omega$:R1) and the second resistance R2 ($\Omega$:R2) such that the output voltage (V_OUT) by the drive power supply circuit 4 is constant toward the output voltage (VCC) of the drive power supply 41. The resistor divider ratio can be changed by changing the resistance constant of the first resistance (R1) and the second resistance (R2), and therefore, it is possible to efficiently adjust the threshold value (threshold value at ON/OFF voltage) when determining high or low, thereby availability in the drive power supply circuit 4 can be improved.

The emitter of NPN bipolar transistor T1 and the emitter of PNP bipolar transistor T2 included in the input circuit 2 are connected by the second conducting path 102. The output voltage (V_OUT) that is stepped down by the resistor divider ratio from the drive power supply circuit 4 is constantly applied to the PNP bipolar transistor T2 of the input circuit 2.

The input circuit 2 includes the PNP bipolar transistor T2, a second pull-up resistance R4, a base resistance R5, a pull-up circuit 3, and an input end 21. The second conducting path 102 is connected to the emitter of the PNP bipolar transistor T2, and the output voltage (V_OUT) that is stepped down by the resistor divider ratio from the drive power supply circuit 4 is constantly applied via the second conducting path 102.

The base of PNP bipolar transistor T2 is connected to the input end 21 via the first conducting path 101. The input end 21 may be configured by a connector terminal, for example, and serve as a connector end. The input voltage to be determined as high or low is entered to the input end 21 (connector end). A collector of PNP bipolar transistor T2 is connected to the voltage conversion circuit 5 via the third conducting path 103. The collector of PNP bipolar transistor T2 corresponds to the output end of the input circuit.

The second pull-up resistance R4 is provided interposingly between the second conducting path 102 and the first conducting path 101. In other words, the second pull-up resistance R4 is connected to the first conducting path 101 at a second connection point S2, and to the second conducting path 102 at a third connection point S3.

The base resistance R5 is provided interposingly between the base of the PNP bipolar transistor T2 and the third connection point S3 (connection point between the second pull-up resistance R4 and the first conducting path 101). According to such a configuration, the resistor divider can be eliminated with respect to the voltage (V: input end 21 voltage) of the input end 21 (connector end) that is connected to the base of the PNP bipolar transistor T2. For example, when a bias resistor built-in digital transistor T3 is used, the internal resistance and the base resistance R5 are connected in series, and there is a concern that the voltage of the input end 21 (connector end) (V: input end 21 voltage) may vary as the resistor divider ratio fluctuates because of variations in the internal resistance. In contrast, by using the PNP bipolar transistor T2 and connecting the second pull-up resistance R4 and the base resistance R5 in parallel, the resistor divider can be eliminated and the accuracy of the threshold value when determining high or low of the input voltage can be improved.

The pull-up circuit 3 includes a pull-up power supply 31, a first pull-up resistance R3, and a second diode D2. The pull-up power supply 31, the first pull-up resistance R3, and the second diode D2 are connected in series, in this order, in a direction of the current flow from the pull-up power supply 31. A cathode of the second diode D2 and the first conducting path 101 are connected at a first connection point S1. Between the first connection point S1 of the first conducting path 101 and the second connection point S2, the first diode D1 is provided interposingly, with the anode facing the second connection point S2 side (base side of the PNP bipolar transistor T2). Since the first pull-up resistance R3 of the pull-up circuit 3 and the second pull-up resistance R4 are connected to the first conducting path 101 in this way, potential of the first conducting path 101 is prevented from being unstable, which makes it possible to efficiently keep the potential fully high corresponding to product specifications.

The input circuit 2 configured as described above serves as a low-side input circuit. The threshold value (threshold value at ON/OFF voltage) at the time of determining low or high with respect to the input voltage (Vin) entered from the input end 21 (connector end) is based on the voltage of input end 21 (V: input end 21 voltage). The voltage of input end 21 (V: input end 21 voltage) is a value subtracting the voltage drop of the first diode D1 (VID: forward voltage) and the voltage drop between the emitter and the base of the PNP bipolar transistor T2 (Vbe) from the output voltage (V_OUT) from the drive power supply circuit 4 (V=V_OUT−Vf−Vbe).

When the threshold value (threshold value at ON/OFF voltage) at the time of determining high or low with respect to the input voltage (Vin) entered to the input end 21 is relatively a small value (low voltage), temperature characteristics of each element such as the PNP bipolar transistor T2 and the first diode D1 have an influence. In contrast, what affects the input voltage (Vin) is the voltage drop of the first diode D1 and the voltage drop between the emitter and base of the PNP bipolar transistor T2, and therefore, variations can be reduced achieving high accuracy of the threshold value.

The voltage conversion circuit 5 is configured by a level shift circuit including a level shift power supply 51 and the digital transistor T3. The digital transistor T3 is an NPN transistor with an internal resistance. The third conductive path 103 extending from the collector of the PNP bipolar transistor T2 of the input circuit 2 is connected to the base of digital transistor T3. A collector of the digital transistor T3 is connected to the micro-computer 6 and the level shift power supply 51. The emitter of the digital transistor T3 is grounded to the ground.

The level shift power supply 51 and a level shift resistance R6 are connected in series, and the level shift resistance R6 is connected to a wire that connects the micro-computer 6 with the collector of the digital transistor T3. In other words, one end of the level shift resistance R6 is connected to the level shift power supply 51 and the other end of the level shift resistance R6 is connected to the wire that connects the micro-computer 6 with the collector of the digital transistor T3.

The digital transistor T3 turns on or off in accordance with the voltage being entered via the third conducting path 103 that is connected to the base. When the digital transistor T3 is off, a high (Hi) voltage from the level shift power supply 51 is entered to the micro-computer 6. When the digital transistor T3 is on, the micro-computer 6 is at a ground potential and a low (Lo) voltage is entered to the micro-computer 6. By configuring the voltage conversion circuit 5 using the level shift circuit in this way, it is possible to satisfy the threshold voltage with respect to the threshold voltage such as the micro-computer 6 that is connected to the voltage conversion circuit 5 without depending on the output voltage from the drive power supply circuit 4.

The micro-computer 6 is a computer that is provided with a calculation function, including a controller such as an MPU, a memory such as RAM or ROM, and an input/output terminal and the like. The micro-computer 6 determines whether the input voltage entered from the input end 21 (connector end) is high (Hi) or low (Lo) in accordance with the output voltage being output form the voltage conversion circuit 5. In the micro-computer 6, for example, the threshold voltage may be installed to determine high (Hi) when the output voltage being output from the voltage conversion circuit 5 is at the threshold voltage or above, and determine low (Lo) when it is less than the threshold voltage. In the present embodiment, the micro-computer 6 is connected to the voltage conversion circuit 5, however, it is not limited to this. For example, an electronic component with a calculation function such as an integrated circuit (IC), an application specific integrated circuit (ASIC), or a field-programmable Gate Array (FPGA) may be connected.

FIG. 3, is an explanatory diagram (timing diagram) describing operations of the input circuit 2 and the like. In this explanatory diagram (timing diagram), operations of the input end 21 (connector end), the NPN bipolar transistor T1 of the drive power supply circuit 4, the PNP bipolar transistor T2 of the input circuit 2, and the digital transistor T3

(micro-computer 6 end) of the voltage conversion circuit 5 are described using the voltage level (Hi and Lo). Reference numerals A to D illustrated in FIG. 3 correspond to the reference numerals indicated by arrows in FIG. 2, and each voltage level (Hi and Lo) illustrates the voltage level (Hi and Lo) at a location indicated by the arrow.

The NPN bipolar transistor T1 of the drive power supply circuit 4 is constantly on, and as described above, the drive voltage that is stepped down in accordance with the resistor divider ratio is applied to the PNP bipolar transistor T2 of the input circuit 2 via the first conducting path 101. The input end 21 (connector end) of the input circuit 2 changes in accordance with the input voltage being entered. For example, the input voltage may change from 12V to 0V.

When the voltage level of the input voltage of the input end 21 (connector end) of the input circuit 2 is high (Hi), the PNP bipolar transistor T2 of the input circuit 2 is off, and the voltage level of the voltage output from the collector of the PNP bipolar transistor T2 is low (Lo). In this case, the digital transistor T3 of the voltage conversion circuit 5 is off, and the voltage level of the emitter of the digital transistor T3, i.e., the voltage of the micro-computer 6 end to which the micro-computer 6 is connected is high (Hi).

When the voltage level of the input voltage of the input end 21 (connector end) of the input circuit 2 is low (Lo), the PNP bipolar transistor T2 is on, and the voltage level of the voltage output from the collector of the PNP bipolar transistor T2 is high (Hi). In this case, the digital transistor T3 of the voltage conversion circuit 5 is on, and the voltage level of the collector of the digital transistor T3, i.e., the voltage of the micro-computer 6 end to which the micro-computer 6 is connected is low (Lo).

The input circuit 2 (low-side input circuit), the drive power supply circuit 4 (emitter follower circuit), and the voltage conversion circuit 5 (level shift circuit) that are provided for the on-board vehicle 1 determine high or low with respect to the input voltage being entered to the input end 21 (connector end) as described above. In this way, each of the input circuit 2 (low-side input circuit), the drive power supply circuit 4 (emitter follower circuit), and the voltage conversion circuit 5 (level shift circuit) is suitably configured, and by combining them, it is possible to efficiently make a determination with respect to the voltage being entered.

Several claims described in the scope of the claims can be mutually combined regardless of citation format. Within the scope of claims, a multiple dependent claim dependent on the several claims may be described. A multiple dependent claim dependent on the multiple dependent claim may be described. Even when the multiple dependent claim dependent on the multiple dependent claim is not described, this does not limit description of the multiple dependent claim dependent on the multiple dependent claim.

The embodiments disclosed herein are provided for exemplary purposes in all aspects and should not be construed as limitations. The scope of the present invention is recited in the scope of the claims, not in the content noted above, and is intended to include equivalents of the scope of the claims and all modifications within the scope.

DESCRIPTION OF REFERENCE NUMERALS

C Vehicle
1 On-board device
101 First conducting path
102 Second conducting path
103 Third conducting path 2 Input circuit (Low-side input circuit)
21 Input end (Connector end)
T2 PNP bipolar transistor
R4 Second pull-up resistance
S2 Second connection point
S3 Third connection point
R5 Base resistance
3 Pull-up circuit
31 Pull-up power supply
R3 First pull-up resistance
D2 Second diode
S1 First connection point
D1 First diode
4 Drive power supply circuit (Emitter follower circuit)
41 Drive power supply
T1 NPN bipolar transistor
R1 First resistance
R2 Second resistance
5 Voltage conversion circuit (Level shift circuit)
51 Level shift power supply
T3 Digital transistor
R6 Level shift resistance
6 Micro-computer

The invention claimed is:

1. An on-board device installed in a vehicle comprising:

an input circuit including an input end into which an input voltage is entered; and a drive power supply circuit that outputs a drive voltage to the input circuit, wherein the input circuit includes a PNP bipolar transistor, a pull-up circuit, a second pull-up resistance, and a base resistance, wherein the pull-up circuit includes a pull-up power supply, a first pull-up resistance, and a second diode with an anode facing the first pull-up resistance, which are connected in series and are provided between a base of the PNP bipolar transistor and the input end;

the second pull-up resistance is provided between the base of the PNP bipolar transistor and the drive power supply circuit;

the base resistance is provided between the base of the PNP bipolar transistor and the second pull-up resistance; and between a connection point of the second pull-up resistance with the base resistance and the input end, a first diode is interposed with a cathode facing the input end.

2. The on-board device according to claim 1, wherein the drive power supply circuit includes a drive power supply, an NPN bipolar transistor, a first resistance, and a second resistance connected with the first resistance in series, and the drive voltage in accordance with a resistor divider ratio from the first resistance and the second resistance is output.

3. The on-board device according to claim 1 further comprising:

a voltage conversion circuit that performs a voltage conversion between the input circuit and a micro-computer, wherein the voltage conversion circuit is a level shift circuit including a level shift power supply and a digital transistor, and the voltage converted by the level shift circuit is output to the micro-computer connected to a collector of the digital transistor.

4. The on-board device according to claim 2 further comprising:

a voltage conversion circuit that performs a voltage conversion between the input circuit and a micro-computer, wherein the voltage conversion circuit is a level shift circuit including a level shift power supply and a digital transistor, and the voltage converted by the level shift circuit is output to the micro-computer connected to a collector of the digital transistor.

* * * * *